United States Patent [19]

Trudeau

[11] Patent Number: 5,183,670

[45] Date of Patent: Feb. 2, 1993

[54] BI-FUNCTIONAL TRANSFER FOOT

[75] Inventor: Allen E. Trudeau, Ansonia, Conn.

[73] Assignee: United Technologies Corporation, Hartford, Conn.

[21] Appl. No.: 693,749

[22] Filed: Apr. 30, 1991

[51] Int. Cl.$^5$ .......................... B29C 31/00; B65H 5/00
[52] U.S. Cl. .................................. 425/126.1; 271/108; 294/64.1; 425/397; 425/403.1
[58] Field of Search ............... 271/107, 108; 294/64.1; 425/110, 121, 123, 125, 126.1, 397, 400, 403.1

[56] References Cited

U.S. PATENT DOCUMENTS

| | | | |
|---|---|---|---|
| 3,853,345 | 12/1974 | Miller | 294/64.1 |
| 4,304,538 | 12/1981 | Lionello | 425/126.1 |
| 4,327,906 | 5/1982 | Frohlich et al. | 221/108 |
| 4,548,396 | 10/1985 | Nelen | 271/108 |
| 4,571,320 | 2/1986 | Walker | 425/403.1 |
| 4,795,597 | 1/1989 | Whiteley et al. | 425/126.1 |
| 4,839,117 | 6/1989 | Swenson et al. | 425/126.1 |
| 4,850,780 | 7/1989 | Safabakhsh et al. | 294/64.1 |
| 4,852,247 | 8/1989 | Hawkswell | 294/64.1 |
| 4,994,240 | 2/1991 | Hayashi | 294/64.1 |

FOREIGN PATENT DOCUMENTS

| | | | |
|---|---|---|---|
| 0282700 | 9/1988 | European Pat. Off. | |
| 475373 | 4/1929 | Fed. Rep. of Germany | 271/108 |
| 1103355 | 3/1961 | Fed. Rep. of Germany | 271/108 |
| 3325207 | 1/1985 | Fed. Rep. of Germany | |
| 9104212 | 3/1991 | France | |
| 52-31455 | 3/1977 | Japan | 294/64.1 |
| 57-4840 | 1/1982 | Japan | 271/108 |
| 1-203193 | 8/1989 | Japan | 294/64.1 |

Primary Examiner—Jay H. Woo
Assistant Examiner—Scott Bushey
Attorney, Agent, or Firm—Terrance J. Radke

[57] ABSTRACT

A bi-functional transfer foot that is structurally configured and operative to provide automated handling of preimpregnated composite materials. The transfer foot includes a valve member having a knock-off stem movably mounted in a housing, a solenoid valve and fluid line interconnection to vacuum and pressure sources, and a control subsystem for regulating the operation of the transfer foot. The transfer foot is bi-functional for "ON" and "OFF" operation. A control signal issued by the control subsystem turns the transfer foot "ON" wherein vacuum forces causes a first displacement of the valve member within the housing to provide a vacuum force for engaging and retaining the tacky surface of preimpregnated composite plies. Termination of the control signal causes the solenoid valve to exert biasing forces to return the transfer foot to the "OFF" state wherein the transfer foot utilizes pressure forces to cause a second displacement of the valve member within the housing that provides a mechanical force via the knock-off stem to disengage and release the tacky surface of preimpregnated composite plies. Individual transfer feet may be automatically, selectively, activated to form predetermined combinations to match the wide variety of sizes and shapes or patterns of preimpregnated composite materials that may be pre-cure processed via automated composite material manufacturing systems.

2 Claims, 2 Drawing Sheets

BI-FUNCTIONAL TRANSFER FOOT

DESCRIPTION

1. Related Application

The present application is related to commonly-owned, co-pending U.S. patent application Ser. No. 07/693,748, entitled INTEGRATED, AUTOMATED COMPOSITE MATERIAL MANUFACTURING SYSTEM AND METHOD filed Apr. 30, 1991.

2. Technical Field

The present invention is directed to material handling apparatus, and more particularly, to a bi-functional transfer foot having utility for automated handling operations involving preimpregnated composite materials, and to a multiplicity of such bi-functional transfer feet disposed in an array and automatically, selectively activatable in predetermined combinations to provide automated material handling in an integrated, automated manufacturing system and method for pre-cure processing of preimpregnated composite materials.

BACKGROUND OF THE INVENTION

Composite materials are typically comprised of a matrix of orientated fibrous material such as graphite, boron, glass, polyimides (e.g. Kevlar), and the like impregnated with an epoxy, polymeric, phenolic or other similar organic resinous material. The use of composite materials to manufacture composite articles, especially in the aerospace industry where the strength/weight ratio of composite materials provides a significant advantage over conventional materials, is on the upswing.

Composite material manufacturing systems and processes may be characterized by the nature of the composite material utilized in the system or process. Such systems or processes are generally characterized as either "prepreg" or "wet resin" systems or processes. Prepreg systems or processes utilize composite materials that are formed by impregnating woven fibrous cloth, yarn, or fiber tow with a predetermined amount of organic resin, and staging and drying the organic resin to form a partially cured ("tacky") composite material (prepreg), which is subsequently packaged in protective film. Prepreg composite material in the tacky condition is handled and processed in all the operations comprising the pre-cure fabrication phase. Wet resin systems or processes such as resin transfer molding or vacuum bagging, in contrast, utilize only the orientated fibrous material matrix in the pre-cure fabrication phase. Organic resin is injected into the orientated fibrous material matrix immediately prior to the initiation of the cure fabrication phase. Prepreg and wet resin manufacturing systems or processes each have distinct advantages and disadvantages in the manufacture of composite articles.

Composite articles may be fabricated utilizing a plurality of stacked, preimpregnated fiber plies which vary in size, shape and fiber matrix orientation. The pre-cure fabrication phase in forming composite articles typically involves several independent operations such as cutting of prepreg composite material into individual prepreg composite plies having the requisite shape, stacking or placing the cut prepreg composite plies in the mold cavity in accordance with the desired fiber orientation (layup), and forming each stacked prepreg composite ply over a mold surface contour to ensure proper compaction (debulking) of stacked prepreg composite plies, e.g., without wrinkling, during curing.

Prior art pre-cure fabrication operations are typically highly labor intensive and time consuming (and thus costly), requiring manual handling of the prepreg composite material/plies during the operations of the pre-cure fabrication phase. For example, the prepreg composite material workpiece or roll generally must be hand-placed into position, cut along guide lines to the desired shape or pattern (configuration), and hand transported to a molding station or cell where the cut prepreg composite ply is hand laid or stacked in a mold cavity. Hand pressure is utilized to conform the stacked prepreg composite ply to the mold surface contour and to tack prepreg composite plies in combination with previously stacked plies. Each prepreg composite ply typically is encased within a protective film material, which facilitates handling of individual prepreg composite plies by protecting the prepreg composite plies from contamination or sticking during handling, that must be manually removed prior to stacking of subsequent prepreg composite plies.

Various attempts have been made to reduce the adverse effects of the labor intensive operations involved in pre-cure processing of preimpregnated composite materials. Electronically controllable suction devices have been utilized for automatic handling of preimpregnated composite materials, with limited success. Such devices were configured and/or operative to match a particular prepreg ply configuration, which limited the flexibility of such devices to a single operational set-up. In addition, such devices did not readily accommodate prepreg ply configurations of exotic configuration, i.e., elaborate contours, holes, etc., of the type typically encountered in aerospace manufacturing applications. Ply transfer cycles, and inspection of ply configuration and location, was generally limited to a single ply per cycle which increased overall processing time.

Some limited success has been achieved in developing an integrated, automated system for cutting preimpregnated composite materials. Such a system automatically dispenses and cuts prepreg composite material utilizing a numerically controlled cutting machine. Cut plies are individually transferred, sans protective films, to a magazine based handling system. A loaded magazine, which constituted a kit of plies, was then delivered by conventional transfer means to a layup or stacking station or cell.

There does not appear to have been any successful attempt to develop a composite material system for pre-cure processing operations wherein the individual operations comprising the pre-cure processing phase were fully automated and integrated with one another. A need exists for an integrated, automatic composite material manufacturing system and method for pre-cure processing of preimpregnated composite materials. Such a system should provide efficient automatic handling of preimpregnated composite materials or plies during all of the operations of the pre-cure processing phase and during any transfers between operations. Furthermore, the system should be integrated so that there is synchronization between the various automated pre-cure processing operations such as cutting, unloading, layup, and forming as well as any intermediate automated handling steps. In addition, the integrated, automated composite material manufacturing system should provide a high degree of quality and repeatability.

Such a system requires an automated material handling apparatus that is capable of automatic handling of preimpregnated composite materials in a reliable, consistent, and efficient manner. Due to the "tacky" nature of preimpregnated composite materials, prior art material handling apparatus utilizing vacuum forces have not proven reliable for automated handling operations involving preimpregnated composite materials. The vacuum forces generated by such prior art material handling apparatus have generally proven sufficient to pickup and retain preimpregnated composite materials in combination with the material handling apparatus.

However, upon termination of the vacuum forces for placement of preimpregnated composite materials, it has been noted that such prior art material handling apparatus did not consistently and reliably release such composite materials. To alleviate this problem, prior art material handling apparatus were modified to apply a positive pressure force against the preimpregnated composite material to disengage such composite material from the handling apparatus. It was found, however, that positive pressure forces applied directly against the preimpregnated composite materials held in combination by the material handling apparatus did not operate as a suitable disengagement mechanism Low magnitude positive pressure forces were not effective in consistently and reliably disengaging preimpregnated composite materials from the material handling apparatus. Large magnitude positive pressure forces, in contrast, while generally sufficient to disengage preimpregnated composite materials from the material handling apparatus, tended to induce displacement errors in the spatial placement positions of the released composite materials, a significant disadvantage in automated composite material manufacturing systems and methods. Complicating the process of determining the proper magnitude for the positive pressure forces for a material handling apparatus is the fact that the "tackiness" of preimpregnated composite materials varies, depending upon a variety of factors such as the shape of the preimpregnated composite material to be handled and the type of organic resin utilized.

A need exists for a material handling apparatus that is capable of automated handling of preimpregnated composite materials in a reliable, consistent, and efficient manner. The material handling apparatus should be capable of automated handling of preimpregnated composite materials of varying sizes and of varying shapes or patterns. The material handling apparatus should be capable of being readily integrated into an automated composite material manufacturing system and method.

SUMMARY OF THE INVENTION

A primary object of the present invention is to provide a bi-functional transfer foot for forming material handling apparatus capable of automated handling of preimpregnated composite materials in a consistent, reliable, and efficient manner.

Another object of the present invention is to provide a bi-functional transfer foot for forming material handling apparatus that is structurally configured and operative to provide a vacuum force for engaging and retaining the "tacky" surface of a preimpregnated composite material and to utilize a pressure force to provide a mechanical force to disengage and release the "tacky" surface of the preimpregnated composite material.

Yet another object of the present invention is to provide a material handling apparatus comprised of a multiplicity of bi-functional transfer feet arranged in an array wherein the transfer feet may be automatically, selectively activated in predetermined combinations to match the sizes and shapes or patterns of a wide variety of preimpregnated composite materials.

These and other objects of the present inventions are achieved by means of a bi-functional transfer foot according to the present invention that is specifically configured and operative to form material handling apparatus for use in automated composite material handling systems for pre-cure processing of preimpregnated composite materials. The bi-functional transfer foot of the present invention is structurally configured and operative to form material handling apparatus that provide reliable, consistent, and efficient automated handling of preimpregnated composite materials having a wide variety of sizes and patterns or shapes. The transfer foot of the present invention has utility in general in pickup heads to provide an automated handling capability, i.e., pickup and placement operations.

A multiplicity of the bi-functional transfer feet according to the present invention are arranged in an array to define a material handling apparatus for preimpregnated composite materials and are operative to be automatically, selectively individually activated to form predetermined combinations that match the wide variety of sizes and shapes or patterns of of preimpregnated composite materials or plies processed in an automated composite material manufacturing system.

The structural configuration of the bi-functional transfer foot is optimized to provide a contact facial area that facilitates interactions with the "tacky" surface of preimpregnated composite materials. The transfer foot further includes a valve member movably mounted in a housing that is structurally configured and operative to provide a vacuum force for engaging and retaining the "tacky" surface of a preimpregnated composite material and to provide a mechanical force to disengage the "tacky" surface of the preimpregnated composite material from the contact facial area of the transfer foot. The transfer foot of the present invention is bi-functional, being operative in an "ON" state to cause a first displacement of the valve member within the housing to provide the vacuum force to engage and retain the "tacky" surface of the preimpregnated composite material (the pickup operation), and being operative in an "OFF" state to provide a pressure force to cause a second displacement of the valve member within the housing which provides a mechanical force to disengage and release the "tacky" surface of the preimpregnated composite ply (the placement operation) from the transfer foot. The transfer foot is maintained in the "OFF" state until the next pickup operation.

The bi-functional transfer foot of the present invention comprises first and second body members configured to be sealingly engaged in combination to define a housing. The exposed end of the second body member is configured as a contact face. A sealing means such as an "O" ring seal is affixed to the contact face, the configuration of the sealing means minimizing the adherence force between the "tacky" surface of the preimpregnated composite material and the transfer foot.

The first body member includes a pneumatic port fluidically interconnected to a cylindrical pneumatic passage. The second body member includes a first cylindrical pneumatic chamber, a second cylindrical pneumatic chamber, and a third cylindrical pneumatic chamber. The first, second, and third cylindrical pneumatic chambers are coaxially, fluidically interconnected. An angled shoulder forming the structural interface between the second and third cylindrical pneumatic chambers functions as a valve seat for the transfer foot. The first cylindrical pneumatic chamber of the second body member is coaxially, fluidically interconnected to the cylindrical pneumatic passage of the first body member of the housing.

Disposed within the second body member is a movable valve member that includes a spherically-shaped head having an integral knock-off stem protruding therefrom. The spherically-shaped head is sized for movement within the second cylindrical pneumatic chamber in response to vacuum or pressure forces acting on the valve member. The spherically-shaped head is further sized to engage the angled shoulder to seal the third cylindrical pneumatic chamber from the second cylindrical pneumatic chamber. The integral knock-off stem has a predetermined length wherein the knock-off stem is operative in the "OFF" state to mechanically disengage the "tacky" surface of a composite material held in combination with the sealing means affixed to the contact face of the bi-functional transfer foot.

The pneumatic port is fluidically interconnected to a vacuum source and a pressure source by means such as a fluid line and a four-way solenoid valve. The four-way solenoid valve is electronically interconnected to a computer control subsystem and operative in response to a control signal therefrom to interconnect the bi-functional transfer foot to the vacuum source.

The operating protocol of the bi-functional transfer foot of the present invention is simplified by operation of the transfer foot only in the "OFF" or the "ON" state. The transfer foot is normally maintained in the "OFF" state by the action of the four-way solenoid valve. In the "OFF" state, the transfer foot is fluidically interconnected to the pressure source. Pressure from the pressure source is fluidically transferred via the pneumatic port, the cylindrical pneumatic passage, the first cylindrical pneumatic chamber, and the second cylindrical pneumatic chamber to exert pressure forces upon the spherically-shaped head to maintain the spherically-shaped head in sealing engagement with the angled shoulder. In the "OFF" state the transfer foot is effectively sealed to air inflow or outflow via the third cylindrical pneumatic chamber, and the knock-off stem extends outwardly from the contact face and is maintained in such position by the pressure forces acting upon the spherically-shaped head.

During a pickup operation, the computer control subsystem provides a control signal to turn the bi-functional transfer foot "ON" when the sealing means and the knock-off stem are proximate the "tacky" surface of the preimpregnated composite material. The control signal causes the four-way solenoid valve to vent pressure from the fluid line, to disconnect the pressure source from the fluid line, and to interconnect the vacuum source to the fluid line so that the vacuum source is fluidically interconnected to the pneumatic port, the cylindrical pneumatic passage, the first cylindrical pneumatic chamber, and the second cylindrical pneumatic chamber. The vacuum source exerts a vacuum force sufficient to displace the valve member out of the second cylindrical pneumatic chamber and into the first cylindrical pneumatic chamber. This displacement causes the third cylindrical pneumatic chamber to be fluidically interconnected to the vacuum source such that a vacuum force is exerted at the opening of the third cylindrical pneumatic chamber formed in the contact face, such vacuum force being sufficient to engage and retain the "tacky" surface of the composite material in combination with the contact face of the transfer foot. In such engaged state, retention of the composite material by the vacuum force exerted by the transfer foot is supplemented by adherence of the "tacky" surface of the preimpregnated composite material to the sealing means affixed to the contact face of the transfer foot.

For placement operations, the computer control subsystem terminates the control signal to the four-way solenoid valve, the biasing action of the four-way solenoid valve causing venting of the fluid line, disconnection of the vacuum source from the fluid line, and interconnection of the pressure source to the fluid line to return the bi-functional transfer foot to the "OFF" state. In the "OFF" state, the pressure source is fluidically interconnected via the pneumatic port, the cylindrical pneumatic passage, the first cylindrical pneumatic chamber, and the second cylindrical pneumatic chamber to exert pressure forces upon the spherically-shaped head to sequentially displace the valve member into the second cylindrical pneumatic chamber and into sealing engagement with the angled shoulder. Concomitantly, this pressure force causes the knock-off stem to be projected outwardly through the opening in the contact face of the bi-functional transfer foot, the knock-off stem contacting the "tacky" surface of the composite material with sufficient force to disengage the composite material from the sealing means affixed to the contact face of the transfer foot.

Also associated with the bi-functional transfer foot is a means secured in combination with the transfer foot and operative in response to signals from the computer control subsystem to cause bi-axial movement of the transfer foot from a retracted position to an extended position and vice versa.

A multiplicity of bi-functional transfer feet, structurally configured and operative as described hereinabove, may be disposed in combination as an array having a configuration optimized for interaction with preimpregnated composite plies having a wide variety of sizes and shapes or patterns. The individual transfer feet may be disposed in combination in a support head as an optimized array that defines the automated pickup head of a material handling apparatus. The support head provides a structure for defining the overall configuration of the array and the initial planar alignment of the sealing means affixed to the contact faces of the transfer feet, protects the transfer feet from damage, and provides a platform for mounting the four-way solenoid valve, the fluid line, and the interconnect wiring associated with each transfer foot.

The multiplicity of bi-functional transfer feet are individually interconnected to a common vacuum source and a common pressure source and individually controlled by the computer control subsystem. Thus, individual transfer feet may be automatically, selectively activated by the computer control subsystem to form predetermined combinations, based upon the known sizes and shapes or patterns of the preimpregnated composite materials as stored in memory of the computer control subsystem, wherein the individually activated transfer feet in combination match the size and pattern or shape of the composite material to be picked up during the pickup operation. The computer control subsystem automatically, selectively activates transfer feet to form the predetermined combination by activating the transfer foot bi-axial movement means to cause the selected transfer feet to extend outwardly from the face of the support head. The extended transfer feet in combination define an operating face that is operative to effect pickup and placement operations under the control of the computer control subsystem.

Those transfer feet that are not part of the combination necessary for the pickup operation are not activated, and in consequence, are not extended. These transfer feet are not directed to the "ON" state by the computer control subsystem during the pickup operation.

BRIEF DESCRIPTION OF THE DRAWINGS

A more complete understanding of the present invention and the attendant features and advantages thereof may be had by reference to the following detailed description when considered in conjunction with the accompanying drawings wherein.

DETAILED DESCRIPTION OF PREFERRED EMBODIMENTS

Figure 1A:
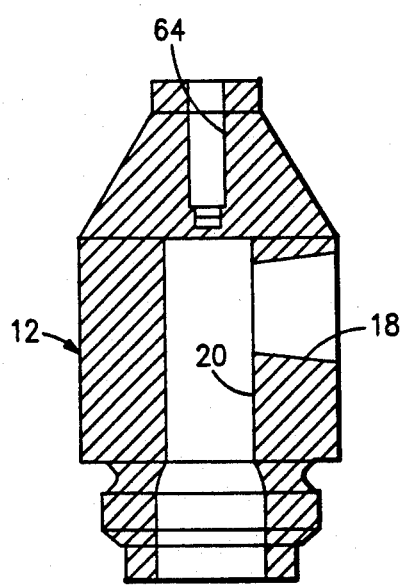
FIGS. 1A, 1B are cross-sectional views of the body members of a bi-functional transfer foot according to the present invention.
Figure 1B:
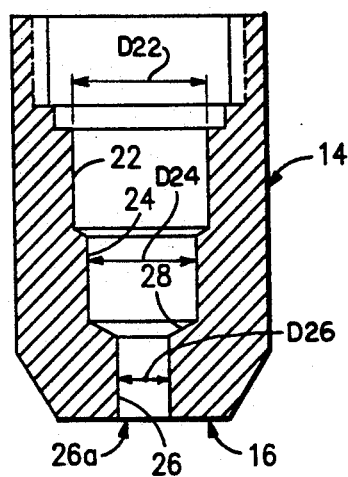
Figure 2:
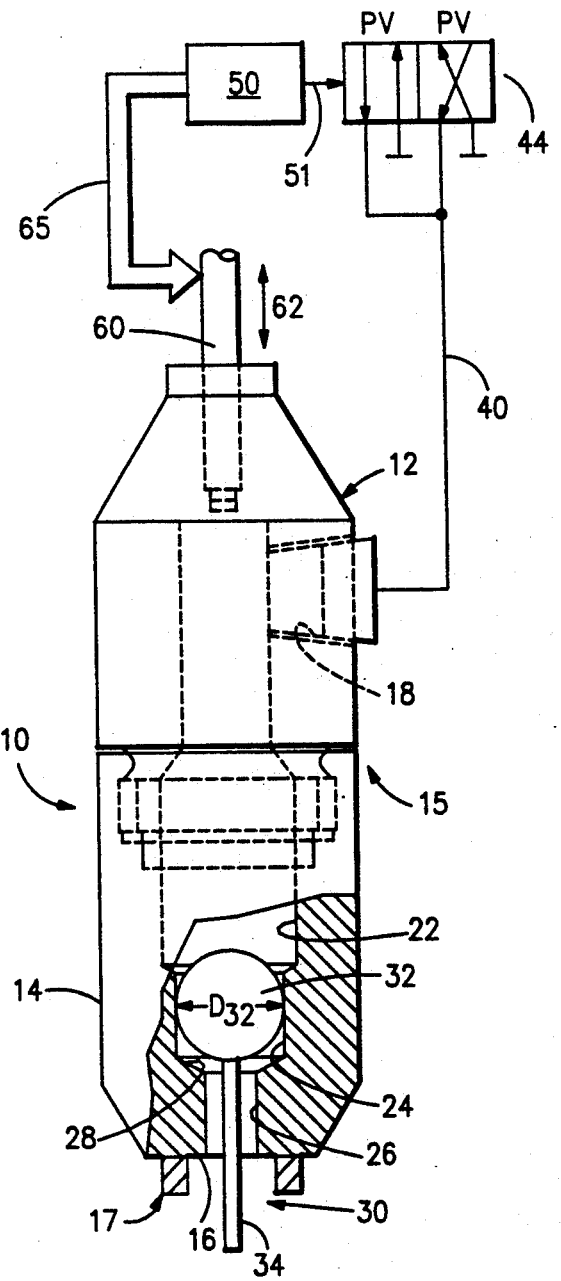
FIG. 2 is a plan view, in partial cross section of the bi-functional transfer foot of the present invention.

Referring now to the drawings wherein like reference numerals identify corresponding or similar elements throughout the several views, FIGS. 1A, 1B, 2 illustrate an embodiment of a bi-functional transfer foot 10 according to the present invention. The transfer foot 10 of the present invention is especially designed for forming a material handling apparatus for preimpregnated composite material for use in an automated composite material manufacturing system, and more particularly, for an automated composite material manufacturing system for pre-cure processing of preimpregnated composite materials such as described in commonly-owned, co-pending U.S. patent application Ser. No. 07/693,748, entitled INTEGRATED, AUTOMATED COMPOSITE MATERIAL MANUFACTURING SYSTEM AND METHOD filed Apr. 30, 1991.

The bi-functional transfer foot 10 of the present invention is structurally configured and operative to provide reliable, automated handling of preimpregnated composite materials (as used herein the term "materials" includes plies, i.e, composite material that has been cut to a particular pattern or shape). The transfer foot 10 described hereinbelow has utility generally in forming automated pickup heads that provide an automated handling capability, i.e., pickup and placement operations, for preimpregnated composite materials, and more particularly, to provide the automated preimpregnated composite ply handling capability for ply transfer end effectors of the type described in U.S. patent appliciation Ser. No. 07/693,748, entitled INTEGRATED, AUTOMATED COMPOSITE MATERIAL MANUFACTURING SYSTEM AND METHOD filed Apr. 30, 1991.

A multiplicity of the bi-functional transfer feet 10 may be arranged in an array to define an automated pickup head capable of handling preimpregnated composite materials such as the ply transfer end effector described in the above-identified patent application. The bi-functional transfer feet are operative to be automatically, selectively individually activated in predetermined combinations, as described hereinbelow in further detail, that match the wide variety of sizes and shapes or patterns of preimpregnated composite materials or plies processed in the automated composite material manufacturing system and method described in the above-identified application.

The structural configuration of the bi-functional transfer foot 10 is optimized to provide a contact facial area that facilitates interactions with the "tacky" surface of preimpregnated composite materials. The transfer foot 10 further includes a valve member movably mounted in a housing that is structurally configured and operative to provide a vacuum force for engaging and retaining the "tacky" surface of a preimpregnated composite material and to provide a mechanical force to disengage the "tacky" surface of the preimpregnated composite material from the contact facial area of the transfer foot 10. The transfer foot 10 of the present invention is bi-functional, being operative in an "ON" state to cause a first displacement of the valve member within the housing to provide the vacuum force to engage and retain the "tacky" surface of the preimpregnated composite material (the pickup operation), and being operative in an "OFF" state to provide a pressure force to cause a second displacement of the valve member within the housing which provides a mechanical force to disengage and release the "tacky" surface of the preimpregnated composite ply from the transfer foot 10 (the placement operation). The transfer foot 10 is maintained in the "OFF" state until the next pickup operation.

The bi-functional transfer foot 10 of the present invention comprises first and second body members 12, 14 configured to be sealingly engaged in combination, as illustrated in FIG. 2, to form a housing 15. The exposed end of the second body member 14 is configured as a contact face 16. A sealing means 17 such as a closed foam rubber "O" ring seal is affixed to the contact face 16. The configuration of the sealing means 17 minimizes the adherence force between the "tacky" surface of the preimpregnated composite material and the transfer foot 10.

The transfer foot 10 may be fabricated from any material that is conventionally utilized to form valve members, i.e., that provides durability to ensure no variations in dimensional tolerances over numerous operation cycles, and which is generally compatible with the organic resins utilized in the preimpregnated composite material to be handled. The transfer foot 10 may be formed by any conventional fabrication technique such as machining, injection molding, etc. The embodiment illustrated in the drawings and described herein has an overall length of about 2.2 inches, a maximum diameter of about 0.75 inches, and a contact face diameter of about 0.50 inches.

The first body member 12 includes a pneumatic port 18 fluidically interconnected to a cylindrical pneumatic passage 20. The second body member 14 includes a first cylindrical pneumatic chamber 22, a second cylindrical pneumatic chamber 24, and a third cylindrical pneumatic chamber 26. The first, second, and third cylindrical pneumatic chambers 22, 24, 26 are coaxially, fluidically interconnected. An angled shoulder 28 forming the structural interface between the second and third cylindrical pneumatic chambers 24, 26 functions as a valve seat for the bi-functional transfer foot 10, as described in further detail hereinbelow.

As is evident from the drawings, the diameter D22 of the first cylindrical pneumatic chamber 22 is greater than the diameter D24 of the second cylindrical pneumatic chamber 24, which in turn, is greater than the diameter D26 of the third cylindrical pneumatic chamber 26. The first cylindrical pneumatic chamber 22 of the second body member 14 is coaxially, fluidically interconnected to the cylindrical pneumatic passage 20 of the first body member 12. For the embodiment illustrated in FIG. 2, the diameter D22 has a magnitude of about 0.39 inches, the diameter D24 has a magnitude of about 0.314 inches, and the diameter D26 has a magnitude of about 0.15 inches.

Disposed within the second body member 14 is a movable valve member 30 that includes a spherically-shaped head 32 having an integral knock-off stem 34 protruding therefrom. The spherically-shaped head 32 is sized, as illustrated by the predetermined diameter D32, for movement within the second cylindrical pneumatic chamber 24 in response to vacuum or pressure forces acting on the valve member 30. The spherically-shaped head 32 is further sized to engage the angled shoulder 28 to seal the third cylindrical pneumatic chamber 26 from the second cylindrical pneumatic chamber 24. The integral knock-off stem 34 has a predetermined length such that, as the spherically-shaped head 32 is displaced by pressure forces from the first cylindrical pneumatic chamber 22 into the second cylindrical pneumatic chamber 24 in the "OFF" state, the knock-off stem 34 initially contacts the "tacky" surface of a composite material held in combination with the sealing means 17 affixed to the contact face 10 of the bi-functional transfer foot 10.

The pneumatic port 18 is fluidically interconnected to a vacuum source (not shown) and a pressure source (not shown) by means such as a fluid line 40 and a four-way solenoid valve 44, as schematically illustrated in FIG. 2. The four-way solenoid valve 44 is electronically interconnected by any conventional means such as wiring 51 to a computer control subsystem 50 and operative in response to a control signal from the computer control subsystem 50 to interconnect the bi-functional transfer foot 10 to the vacuum source, as discussed in further detail hereinbelow.

The operating protocol of the bi-functional transfer foot 10 of the present invention as described in the preceding paragraphs is simplified since the transfer foot 10 is normally biased to the "OFF" state by the four-way solenoid valve 44, and switches to the "ON" state only in response to a control signal from the computer control subsystem 50. The transfer foot 10 is normally maintained in the "OFF" state by the biasing action provided by the four-way solenoid valve 44. In the "OFF" state, the transfer foot 10 is fluidically interconnected to the pressure source via fluid line 40 and the four-way solenoid valve 44. Pressure from the pressure source is fluidically transferred via the pneumatic port 18, the cylindrical pneumatic passage 20, the first cylindrical pneumatic chamber 22, and the second cylindrical pneumatic chamber 24 to exert pressure forces upon the spherically-shaped head 32 to maintain the spherically-shaped head 32 in sealing engagement with the angled shoulder 28, as illustrated in FIG. 2. In the "OFF" state the transfer foot 10 is effectively sealed to air inflow or outflow via the third cylindrical pneumatic chamber 26, and the knock-off stem 34 extends outwardly from the contact face 16 as illustrated in FIG. 2 and is maintained in such position by the pressure forces acting upon the spherically-shaped head 32.

During a pickup operation, the computer control subsystem 50 provides a control signal to turn the bi-functional transfer foot 10 "ON" when the sealing means 17 and the knock-off stem 34 are proximate the "tacky" surface of the preimpregnated composite material (the term proximate as used herein means immediately prior to the contact of the knock-off stem 34 with the "tacky" surface). The control signal causes the four-way solenoid valve 44 to vent pressure from the fluid line 40, to terminate the interconnection between the pressure source and the fluid line 40, and to interconnect the vacuum source to the fluid line 40 so that the vacuum source is fluidically interconnected to the pneumatic port 18, the cylindrical pneumatic passage 20, the first cylindrical pneumatic chamber 22, and the second cylindrical pneumatic chamber 24. The vacuum source exerts a vacuum force sufficient to displace the valve member 30 out of the second cylindrical pneumatic chamber 24 and into the first cylindrical pneumatic chamber 22. This displacement causes the third cylindrical pneumatic source 26 to be fluidically interconnected to the vacuum source such that a vacuum force is exerted at the opening 26a of the third cylindrical pneumatic chamber 26 formed in the contact face 16, such force being sufficient to engage and retain the "tacky" surface of the composite material to be picked up in combination with the contact face 16 of the transfer foot 10. In the engaged state, retention of the composite material by the vacuum force exerted by the transfer foot 10 is supplemented by adherence of the "tacky" surface of the composite material to the sealing means 17 affixed to the contact face 16 of the transfer foot 10.

For placement operations, the computer control subsystem 50 terminates the control signal to the four-way solenoid valve 44, the biasing action of the four-way solenoid valve 44 causing venting of the fluid line 40, termination of the interconnection between the vacuum source and the fluid line 40, and interconnection between the pressure source and the fluid line 40 to return the bi-functional transfer foot 10 to the "OFF" state. In the "OFF" state, the pressure source is fluidically interconnected via the pneumatic port 18, the cylindrical pneumatic passage 20, the first cylindrical pneumatic chamber 22, and the second cylindrical pneumatic chamber 24 to exert pressure forces upon the spherically-shaped head 32 to displace the valve member 30 into the second cylindrical pneumatic chamber 24 and into sealing engagement with the angled shoulder 28. Concomitantly, this pressure force causes the knock-off stem 34 to contact the "tacky" surface of the held composite material with sufficient force to disengage the composite material from sealing means 17 affixed to the contact face 16 of the transfer foot 10.

Also associated with the bi-functional transfer foot 10 is a means 60 secured in combination with the transfer foot 10 for bi-axial movement (arrow 62) of the transfer foot 10 from a retracted position to an extended position and vice versa. As exemplarily illustrated in FIG. 2, the means 60 may be drive rod disposed in fixed combination in a cylindrical slot 64 formed in the first body member 12. The means 60 is operative in response to control signals provided by the computer control subsystem 50 to cause bi-axial movement of the transfer foot 10 from a retracted position to an extended position and vice versa.

Figure 3A:
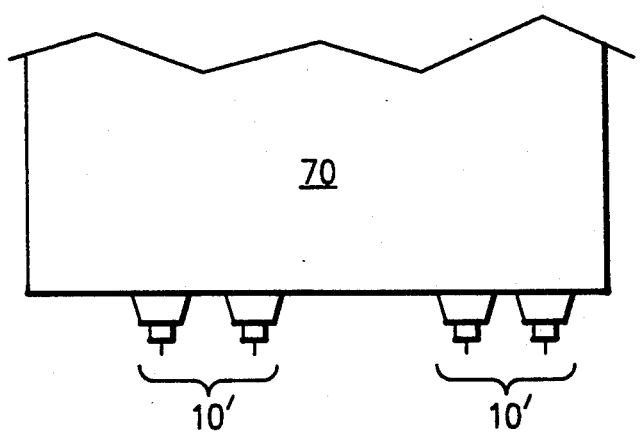
FIG. 3A is a partial plan view of a support head for holding a multiplicity of bi-functional transfer feet in a prearranged array illustrating the retracted position of the transfer feet.
Figure 3B:
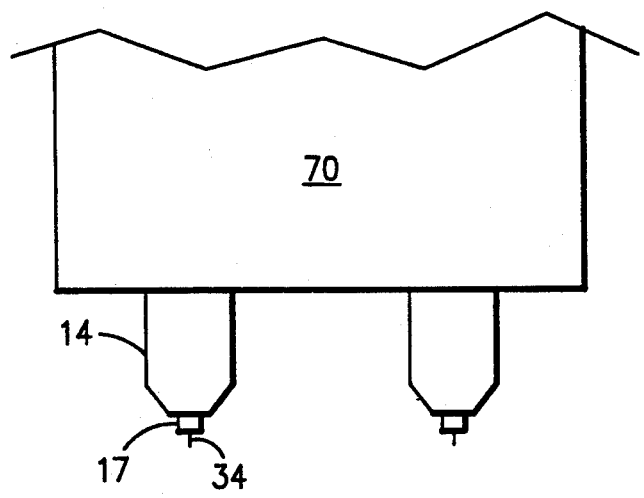
FIG. 3B is a partial plan view of the support head of FIG. 3A illustrating selectively extended transfer feet.

A multiplicity of bi-functional transfer feet 10, each structurally configured and operative as described hereinabove, may be disposed in combination as an array having a configuration optimized for interaction with preimpregnated composite plies having a wide variety of sizes and shapes or patterns. The individual transfer feet 10 may be disposed in combination in a support head 70 as an optimized array that defines an automated pickup head of a material handling apparatus having utility for automated handling of preimpregnated composite materials. Such a pickup head is the ply transfer end effector described in commonly-owned, co-pending U.S. patent application Ser. No. 07/693,748, entitled INTEGRATED, AUTOMATED COMPOSITE MATERIAL MANUFACTURING SYSTEM AND METHOD filed Apr. 30, 1991. Due to the size of the bi-functional transfer feet 10, the individual transfer feet 10 are typically disposed in combination in a support head 70, as exemplarily illustrated in FIGS. 3A, 3B. The support head 70 provides a structure for defining the overall configuration of the array and the initial planar alignment of the sealing means 17 affixed to the contact faces 16 of the transfer feet 10, protects the transfer feet 10 from damage, and provides a platform for mounting the four-way solenoid valve 44, the fluid line 40, and the interconnect wiring 51 associated with each transfer foot 10. The multiplicity of bi-functional transfer feet 10 are individually interconnected to a common vacuum source and a common pressure source and individually controlled by the computer control subsystem 50. Thus, individual transfer feet 10 may be automatically, selectively activated by the computer control subsystem 50 to form predetermined combinations, as exemplarily illustrated in FIG. 3B, based upon the known sizes and shapes or patterns of the preimpregnated composite materials as stored in memory of the computer control subsystem 50, wherein the individually activated transfer feet 10 in combination match the size and shape or pattern of the preimpregnated composite material to be picked up during the pickup operation. The computer control subsystem 50 automatically, selectively activates transfer feet 10 to form the predetermined combination by activating the appropriate transfer foot bi-axial movement means 60 to cause the selected transfer feet 10' to extend outwardly from the face of the support head 70, as illustrated in FIG. 3. The extended transfer feet 10' in combination define an operating face that is operative to effect the pickup and placement operations under control of the computer control subsystem 50.

Those transfer feet 10 that are not part of the pattern necessary for the pickup operation are not activated, and in consequence, are not extended, i.e., the sealing means 17 of the contact faces 16 of such transfer feet 10 remain coplanar with the face of the support head 70, as exemplarily illustrated in FIG. 3A. These transfer feet 10 are not directed to the "ON" state by the computer control subsystem 50 during the pickup operation.

A variety of modifications and variations of the present invention are possible in light of the above teachings. It is therefore to be understood that, within the scope of the appended claims, the present invention may be practiced otherwise than as specifically described hereinabove.

What is claimed is:

1. A bi-functional transfer foot for performing pickup and placement operations on a tacky surface of preimpregnated composite materials, said bi-functional transfer foot being activated to perform pickup operations in response to a vacuum force provided by a vacuum source, said bi-functional transfer foot being operative to perform placement operations in response to a pressure force provided by a pressure source, said bi-functional transfer foot being alternately fluidically interconnected to the vacuum source and the pressure source by a switching valve, and wherein activation and operation of said bi-functional transfer foot is provided by control means that provides a control signal for regulating operation of the switching valve, comprising:

valve means structurally configured and operative for utilizing the vacuum force for engaging and retaining the tacky surface of preimpregnated composite materials for pickup operations and for utilizing the pressure source to generate a mechanical force to disengage and release the tacky surface of preimpregnated composite materials for placement operations, said valve means including a valve housing including a first body member and a second body member sealingly engaged in combination, said second body member having a contact face at one exterior end thereof, said second body member having first, second, and third fluidically interconnected cylindrical chambers coaxially formed therein and an angled shoulder intermediate said second and third cylindrical chambers, said first body member including a pneumatic port fluidically interconnected to the switching valve and a cylindrical pneumatic passage fluidically interconnecting said pneumatic port to said first cylindrical chamber, said first, second, and third cylindrical chambers having first, second, and third diameters, respectively, wherein said first diameter is greater than said second diameter and said second diameter is greater than said third diameter, and wherein said contact face has an opening fluidically interconnected to said third cylindrical chamber and defined by said third diameter thereof, a sealing member affixed to said contact face to circumscribe said opening thereof, said sealing member having a configuration to minimize adherence between said sealing member and the tacky surface of preimpregnated composite materials during pickup operations, and a valve member displaceable within said second body member between said second cylindrical chamber and said first cylindrical chamber and vice versa in response to the vacuum force and the pressure force, respectively, said valve member including a spherical head having an integral knock-off stem protruding therefrom, said spherical head having a predetermined configuration such that displacement of said valve member from said first cylindrical chamber to said second cylindrical chamber in response to the pressure force causes said spherical head to set against said angled shoulder wherein a seal is provided between said second cylindrical chamber and said third cylindrical chamber that effectively terminates airflow through said third cylindrical chamber, and wherein said knock-off stem has a predetermined length such that said knock-off stem provides the mechanical force to disengage and release the tacky surface of preimpregnated composite materials from said bi-functional transfer foot during placement operations when said spherical head is caused to seat against said angled shoulder; and wherein the control means regulates the switching valve to cause bi-functional operation of said valve means in ON and OFF states for pickup and placement operations, respectively, said bi-functional transfer foot being normally biased to said OFF state by the switching valve wherein the pressure source is fluidically interconnected to said pneumatic port so that said movable valve member is positioned in response to the pressure force so that said spherical head thereof is seated against said angled shoulder and said knock-off stem protrudes beyond said sealing member, and wherein the switching valve fluidically interconnects the vacuum source to said pneumatic port to activate said bi-functional transfer foot to said ON state in response to the control signal from the control means when said sealing member and said knock-off stem are proximate the tacky surface of preimpregnated composite materials wherein said valve member is displaced within said second body member from said second cylindrical chamber into said first cylindrical chamber to cause said spherical head to unseat from said angled shoulder so that the vacuum force is fluidically interconnected to said third cylindrical chamber and exerted at said opening to engage and retain the tacky surface of preimpregnated composite materials, and further wherein the tacky surface adheres to the sealing member with the tacky surface of preimpregnated composite materials engaged and retained by the vacuum force exerted by said bi-functional transfer foot.

2. The bi-functional transfer foot of claim 1 wherein said sealing member is an O-ring.

* * * * *